United States Patent
Ray et al.

(10) Patent No.: US 7,539,003 B2
(45) Date of Patent: May 26, 2009

(54) CAPACITIVE MICRO-ELECTRO-MECHANICAL SENSORS WITH SINGLE CRYSTAL SILICON ELECTRODES

(75) Inventors: Curtis A. Ray, Alamo, CA (US); Janusz Bryzek, Fremont, CA (US)

(73) Assignee: LV Sensors, Inc., Emeryville, CA (US)

( * ) Notice: Subject to any disclaimer, the term of this patent is extended or adjusted under 35 U.S.C. 154(b) by 103 days.

(21) Appl. No.: 11/707,347

(22) Filed: Feb. 16, 2007

(65) Prior Publication Data

US 2007/0279832 A1    Dec. 6, 2007

Related U.S. Application Data

(63) Continuation-in-part of application No. 11/292,946, filed on Dec. 1, 2005.

(60) Provisional application No. 60/791,790, filed on Apr. 13, 2006.

(51) Int. Cl.
*H01G 7/00* (2006.01)
(52) U.S. Cl. .................. 361/277; 361/272; 361/278; 361/281; 361/290; 361/292
(58) Field of Classification Search ......... 361/722–723, 361/727–728, 729, 280, 286–287, 277, 272–273, 361/278, 283.3, 290–292
See application file for complete search history.

(56) References Cited

U.S. PATENT DOCUMENTS

| | | | |
|---|---|---|---|
| 5,511,428 A | 4/1996 | Goldberg et al. | |
| 6,212,056 B1 | 4/2001 | Gammel et al. | |
| 6,341,527 B1 | 1/2002 | Ishikura et al. | |
| 6,377,438 B1 * | 4/2002 | Deane et al. ................. | 361/278 |
| 6,507,475 B1 * | 1/2003 | Sun ............................. | 361/281 |
| 6,815,739 B2 * | 11/2004 | Huff et al. ................... | 257/275 |
| 6,909,589 B2 * | 6/2005 | Huff ........................... | 361/281 |
| 6,922,327 B2 * | 7/2005 | Chua et al. .................. | 361/278 |
| 6,930,368 B2 | 8/2005 | Hartwell et al. | |
| 6,948,374 B2 | 9/2005 | Miyashita | |
| 7,111,518 B1 | 9/2006 | Allen et al. | |
| 2002/0167072 A1 | 11/2002 | Andosca | |
| 2005/0183508 A1 | 8/2005 | Sato | |
| 2006/0101912 A1 | 5/2006 | Wu et al. | |

OTHER PUBLICATIONS

Sridhar et al "Trench Oxide Isolated Single Crystal Silicon Micromachined Accelerometer" (1998) IEDM pp. 17.5.1-17.5.4.

* cited by examiner

*Primary Examiner*—Nguyen T Ha
(74) *Attorney, Agent, or Firm*—Lumen Patent Firm

(57) ABSTRACT

The devices presented herein are capacitive sensors with single crystal silicon on all key stress points. Isolating trenches are formed by trench and refill forming dielectrically isolated conductive silicon electrodes for drive, sense and guards. For pressure sensing devices according to the invention, the pressure port is opposed to the electrical wire bond pads for ease of packaging. Dual-axis accelerometers measuring in plane acceleration and out of plane acceleration are also described. A third axis in plane is easy to achieve by duplicating and rotating the accelerometer 90 degrees about its out of plane axis Creating resonant structures, angular rate sensors, bolometers, and many other structures are possible with this process technology. Key advantages are hermeticity, vertical vias, vertical and horizontal gap capability, single crystal materials, wafer level packaging, small size, high performance and low cost.

10 Claims, 10 Drawing Sheets

CAPACITIVE MICRO-ELECTRO-MECHANICAL SENSORS WITH SINGLE CRYSTAL SILICON ELECTRODES

CROSS-REFERENCE TO RELATED APPLICATIONS

This application claims priority from U.S. Provisional Patent Application No. 60/791,790, filed Apr. 13, 2006, which is incorporated herein by reference. This application is a continuation-in-part of U.S. patent application Ser. No. 11/292,946, filed Dec. 1, 2005, which is incorporated herein by reference.

FIELD OF THE INVENTION

The present invention relates generally to sensors. More particularly, the present invention relates to capacitive micro-electro-mechanical sensors with single crystal silicon electrodes.

BACKGROUND

Several fabrication features cause a reduction in the accuracy and durability of capacitive sensors. The use of different materials on the top and bottom surfaces of the capacitive gap leads to thermal mismatch between the top and bottom of the gap. Use of metal electrodes limits the ability to form a high temperature fusion bond between two wafers, which limits the ability to seal the device hermetically. Construction of a pressure port on the same surface as the wirebond pads leads to a difficult exposure problem of the wirebond pads to the harsh media being measured.

Current fabrication methods address some of these concerns, but not others. For example, many methods use electrically conductive metal vias to place electrical interconnects on the opposite side of a sensor from the active sensor elements. However, these fabrication methods have several disadvantages. For example, extra fabrication steps must be used to pattern the electrically conductive metal vias in the sensor. In addition, the use of metal gives rise to the complications described above. Accordingly, there is a need in the art to develop methods of fabricating capacitive sensors that allow hermetic sealing, reduce or eliminate thermal mismatch, and limit exposure of wirebond pads

SUMMARY OF THE INVENTION

The present invention provides capacitive micro-electromechanical sensors having single crystal silicon electrodes. The sensors preferably sense at least one of pressure, acceleration, angular rate or resonance. The sensors include two layers. The first layer is made of single-crystal silicon and has a top surface and a bottom surface. The first layer forms at least one electrode. The second layer is also made of single crystal silicon and has a top surface and a bottom surface. At least one electrode is defined in the second layer by an insulating trench of dielectrical material that extends from the top surface to the bottom surface of the layer. Preferably, this insulating trench forms a periphery around this electrode. Also preferably, the second layer further includes at least one electrical guard, wherein the at least one electrical guard is defined by a second insulating trench of dielectrical material that extends from the top surface to the bottom surface of the second layer. The at least one electrode in the first layer and the at least one electrode in the second layer together define a capacitor. Preferably, the top surface of the second layer is etched to form a cavity, which forms the capacitive gap. The sensor further includes at least one electrical contact situated on the bottom surface of the second layer. This electrical contact is in electrical connection with the at least one electrode in the second layer.

In a preferred embodiment, the first layer forms a diaphragm. The first layer may also be etched to define a resonant structure, spring, or proof mass.

In another preferred embodiment, the sensor further includes a third single crystal silicon layer, which is separated from the top surface of the top layer by a dielectric layer. In one embodiment, this third layer is etched to define a pressure port. In this embodiment, the sensor senses pressure, with the advantage that the pressure port is on the opposite side of the device from the electrical contacts.

BRIEF DESCRIPTION OF THE FIGURES

The present invention together with its objectives and advantages will be understood by reading the following description in conjunction with the drawings, in which.

DETAILED DESCRIPTION OF THE INVENTION

In the following description, structures that appear in different figures are identically labeled.

Figure 1:
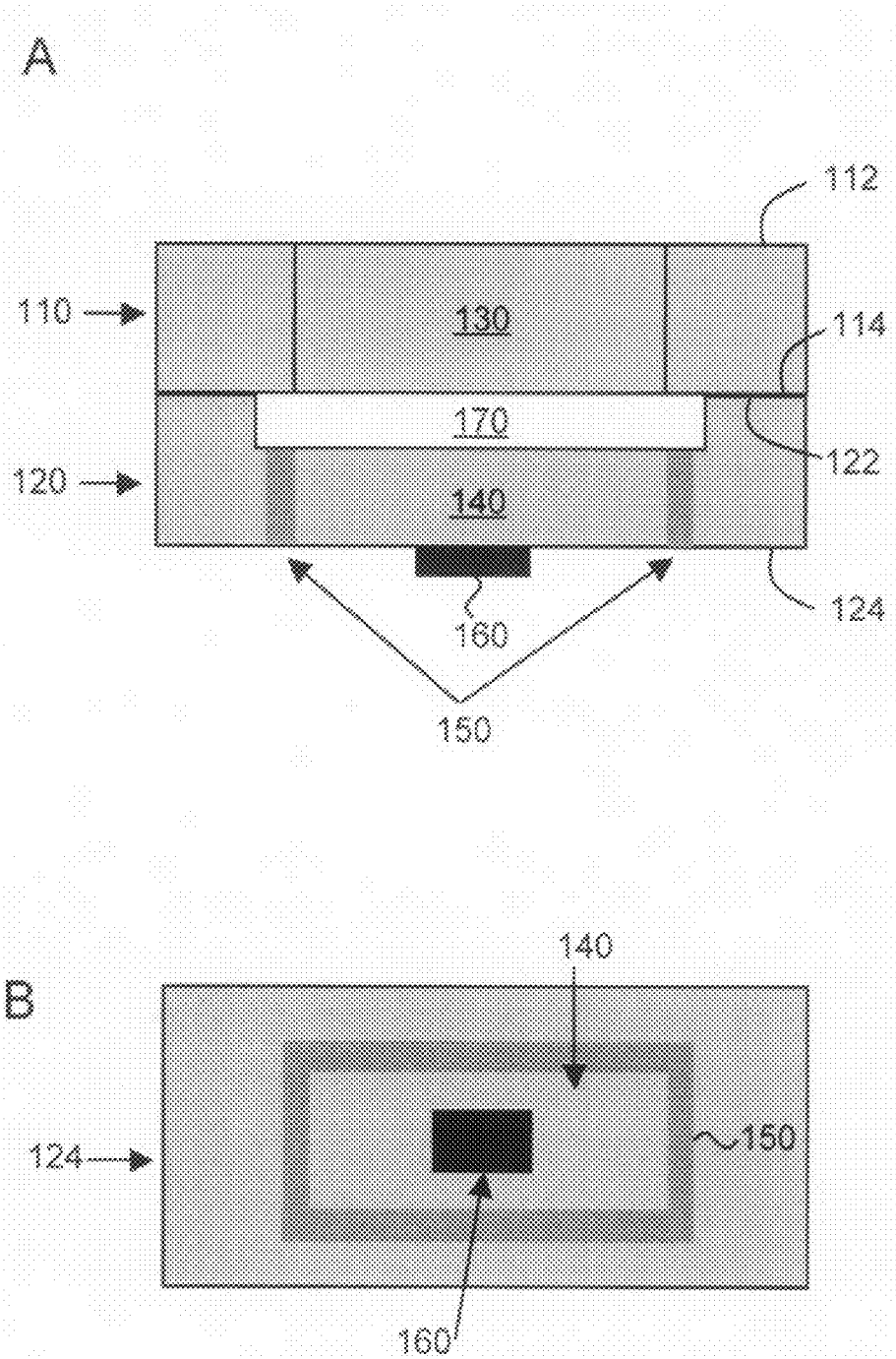
FIG. 1 shows a cross-section (A) and a plan view from the pad side (B) of a sensor according to the present invention.

FIG. 1A shows a cross-sectional view of a capacitive micro-electromechanical sensor according to the present invention. The sensor includes a first layer 110, with top surface 112 and bottom surface 114. First layer 110 is made of single crystal silicon and contains at least one electrode 130. The sensor further includes a second layer 120, with a top surface 122 and a bottom surface 124. Second layer 120 contains an isolating trench 150 made of dielectrical material that extends from top surface 122 to bottom surface 124. Isolating trench 150 defines electrode 140. Electrode 140 is electrically connected to electrical contact 160, such as a wire-bond pad. Preferably, first layer 110 contains all of the sensing elements of the sensor, such that the sensing elements are on the opposite side of the sensor to electrical contact 160. Electrodes 130 and 140 together define a capacitor, with capacitive gap 170. Capacitive gap 170 is preferably formed in second layer 120 to allow precise spatial definition of gap 170.

FIG. 1B shows a plan view of the bottom surface 124 of second layer 120. FIG. 1B shows that isolating trench 150 forms a periphery around electrode 140 in order to define electrode 140. While a square trench is shown in the figure, trench 150 may be of any geometry.

Figure 2:
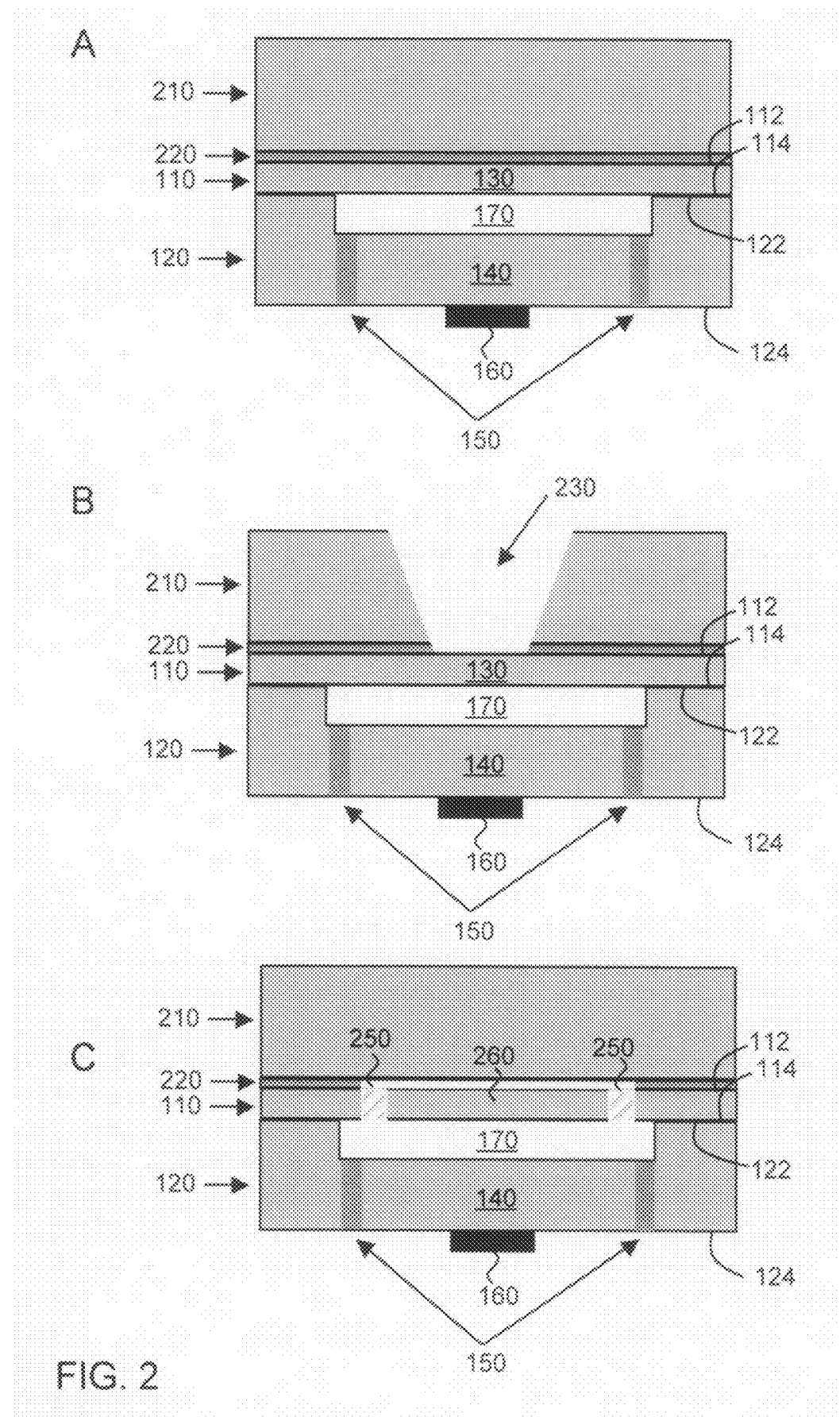
FIG. 2 shows examples (A), (B), (C) of sensors according to the present invention.

FIG. 2 shows several embodiments of a sensor according to the present invention. FIG. 2A shows a sensor having a third single crystal silicon layer 210, which is separated from top surface 112 of first layer 110 by a dielectric layer 220. In this sensor, first layer 110 has been thinned to form a diaphragm 130. In a preferred embodiment, third layer 230 is etched to form a pressure port 230 (FIG. 2B). Alternatively, or in addition, first layer 110 may be etched to define, for example, a proof mass 260, springs 250, or a resonant structure (not shown). First layer 110 may be released for device movement by etch removal of dielectric layer 220. (FIG. 2C).

Figure 3:
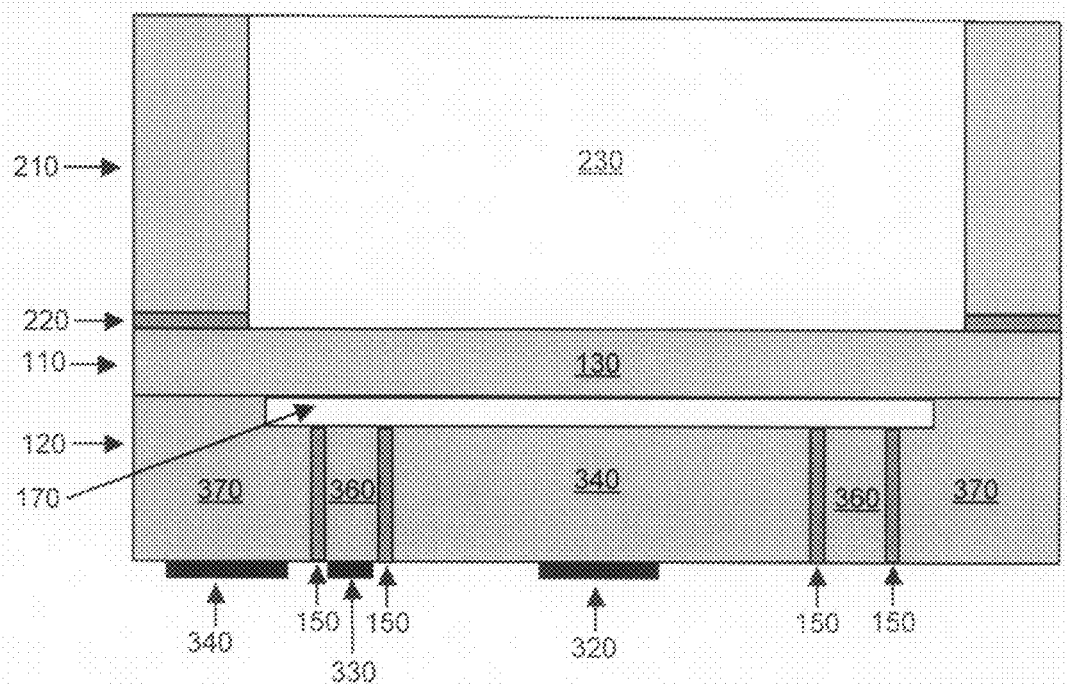
FIG. 3 shows a cross-section (A) and a plan view from the pad side (B) of a pressure sensor according to the present invention.
Figure 3:
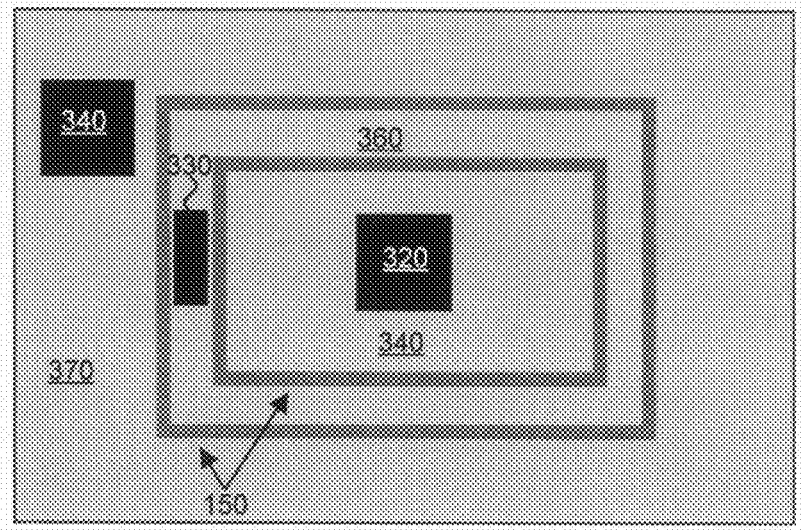

FIG. 3A shows a cross-sectional view of a preferred pressure sensor according to the present invention. The pressure sensor has a first single crystal silicon layer 110, which has been milled or etched to form diaphragm 130. Diaphragm 130 serves as a first electrode in a capacitor. The pressure sensor also has a second single crystal silicon layer 120, which has been etched to form a cavity 170. Second single crystal silicon layer 120 includes two isolating trenches 150. Isolating trenches 150 define a stationary electrode 340, which forms the second electrode of the capacitor; an electrical guard 360; and a driven common port 370. Stationary electrode 340, electrical guard 360 and driven common port 370 are electrically connected to metal bond pads 320, 330, and 340, respectively. The pressure sensor also has a third single crystal silicon layer 210, which is separated from diaphragm 130 by dielectric layer 220. Layer 220 may be, for example, a buried oxide layer. Layer 210 is etched to form a pressure port 230. Notice in this sensor that single crystal silicon is used at all key pressure points, no metal is needed within the sensor, and the pressure port is situated opposite to the sensitive metal bond pads.

FIG. 3B shows a planar view of this pressure sensor from the bottom surface of the sensor. Isolation trenches 150 can be seen to define stationary electrode 340, electrical guard 360, and common drive port 370. These electronic components are in electrical connection with metal bond pads 320, 330, and 340, respectively.

FIG. 4A shows a cross-sectional view and FIG. 4B shows a plan view of a preferred accelerometer according to the present invention. In one embodiment, the accelerometer is built in the same die as the pressure sensor described in FIG. 3. The accelerometer has a first single crystal silicon layer 110, which has been etched to form trenches 430 and accelerometer shuttle 420. The sensor also has a second silicon layer 120, which has been etched to form a cavity 170. Second single crystal silicon layer 120 includes isolating trenches 150 which define a common drive port 460 and four electrodes, 440, 442, 444, and 450. The common drive port 460 and four electrodes 440, 442, 444, and 450 are electrically connected to metal bond pads 490, 470, 480, 492, and 494, respectively. The accelerometer also has a third single crystal silicon layer 210, which is separated from first layer 130 by dielectric layer 220. Layer 220 may be, for example, a buried oxide layer. Layer 220 is etched to give gap 410 for the accelerometer shuttle 420. While the accelerometer shown is a dual axis accelerometer that measures in plane acceleration and out of plane acceleration, a third axis in plane is easy to achieve by duplicating and rotating the accelerometer 90 degrees about its out of plane axis FIG. 5A shows a plan view and FIG. 5B shows an isometric view of accelerometer shuttle 420. Finger electrodes 510, isolated support 515, lateral springs 520, lateral spring ends 525, rotational springs 530, proof mass 540, gimbal frame 550, and isolation trenches 560 are shown. Finger electrodes 510 are attached to an isolated support 515 which would connect to either electrode 442 or 444. All of these structures are created through etching of first layer 120, as described below.

Steps 1-17, shown in FIGS. 6-10, are schematic depictions of an example of manufacturing process steps for making a sensor according to the present invention. Steps 1-3 are used for processing a SOI wafer, steps 4-10 are used for processing isolation trenches, and steps 11-17 are dual-wafer processing steps. In this example, the steps show a method of simultaneously fabricating a pressure sensor along with an accelerometer according to the invention. Alternatively, a sensor that senses only pressure sensor could be built by eliminating steps 2 and 3. Modifications to the following steps can be made to create other types of sensors according to the present invention. For example, polysilicon layers can be added and patterned similar to surface micromaching. Adding these layers to layer 612 allows for these layers to be inside the cavity 730 and not interfere with the bonding surfaces 910

Step 1 forms an oxide 620 on a SOI wafer 610 by oxidation. SOI wafer 610's thinner active layer 612 eventually forms a diaphragm, such as diaphragm 130 in FIG. 2B. Layer 612 is relatively highly doped between about 0.1 to 0.01 Ohms/cm to be used as a conductive electrode surface. The thicker handle layer 614 forms third layer 210 depicted in FIG. 2. Step 2 patterns and etches the oxide 620 through photolithography and wet oxide etch to give openings 630 in the oxide 620, such that the underlying silicon 612 can be etched in step 3.

Figure 5:
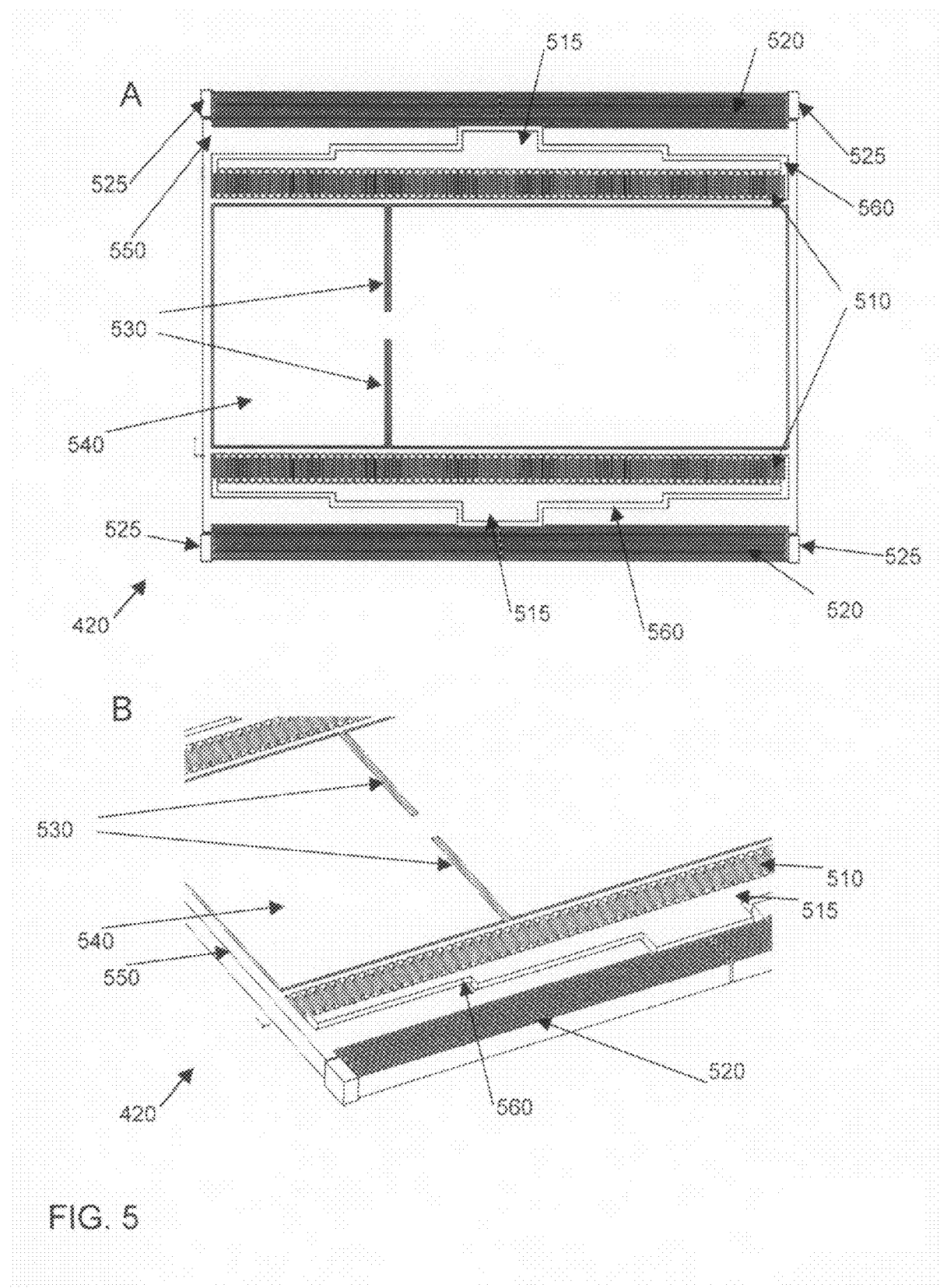
FIG. 5 shows a plan view (A) and an isometric view (B) of an accelerometer shuttle according to the present invention.
Figure 6:
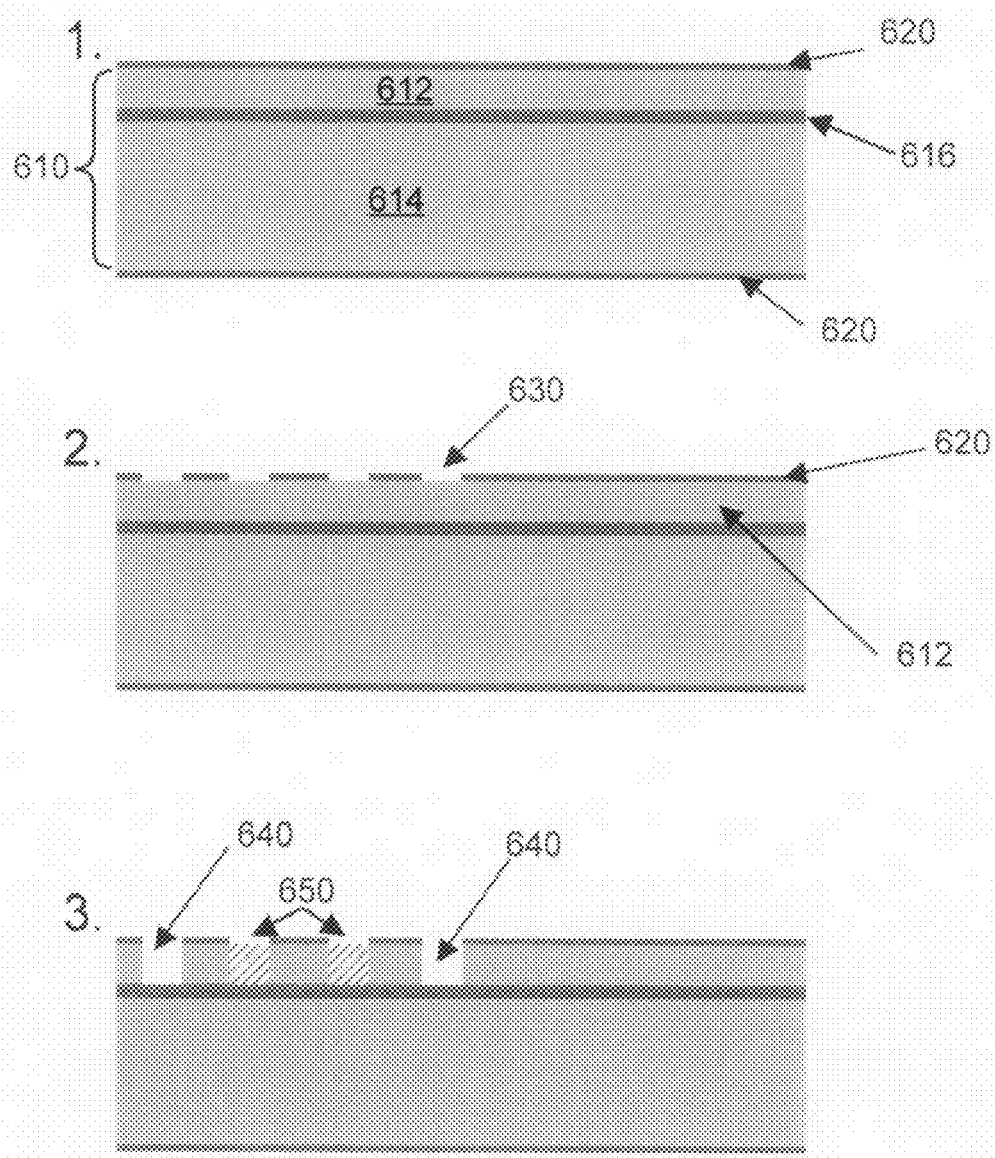
FIGS. 6-10 show schematics of steps for manufacturing sensors according to the present invention.
Figure 7:
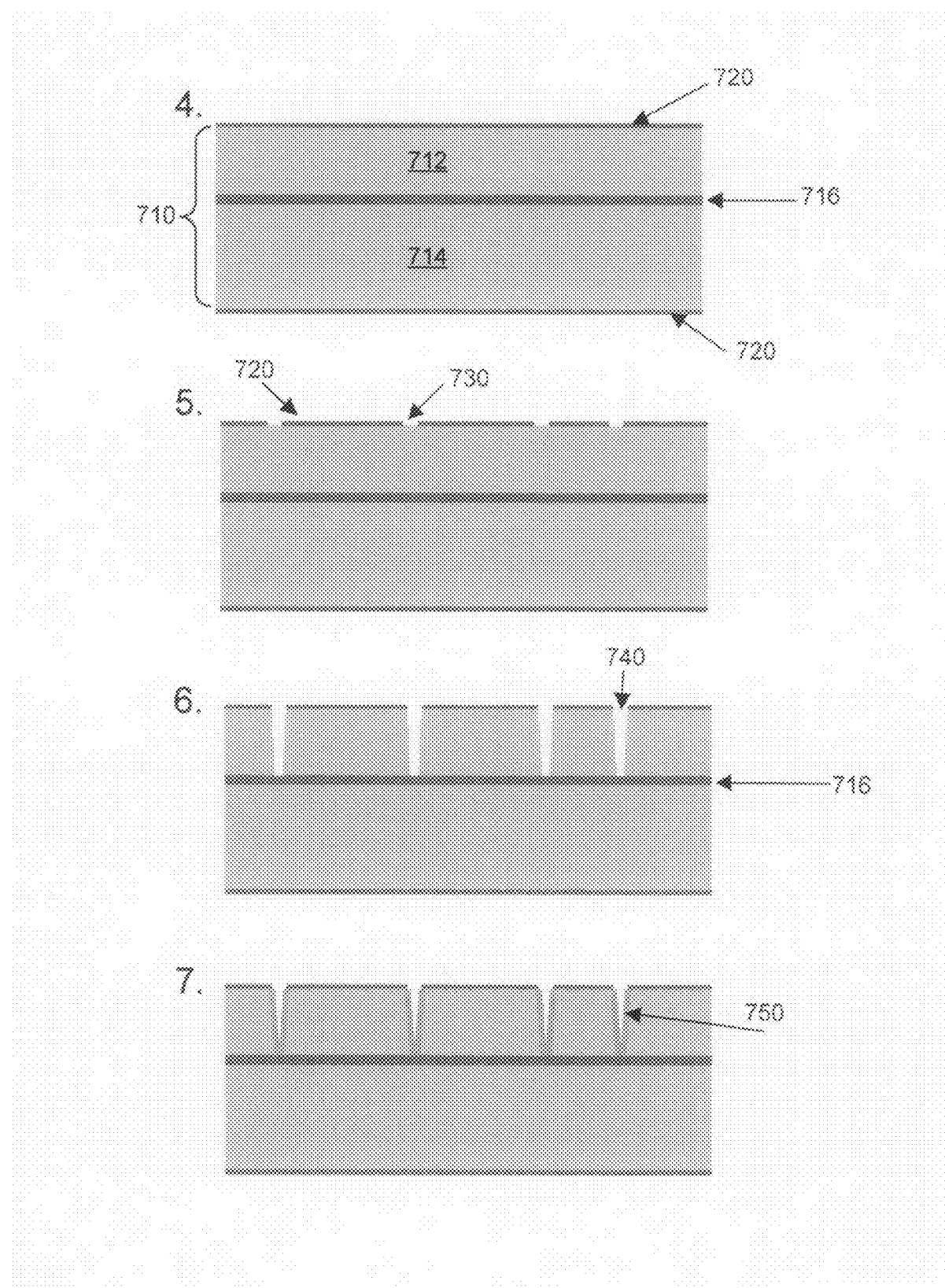
Figure 8:
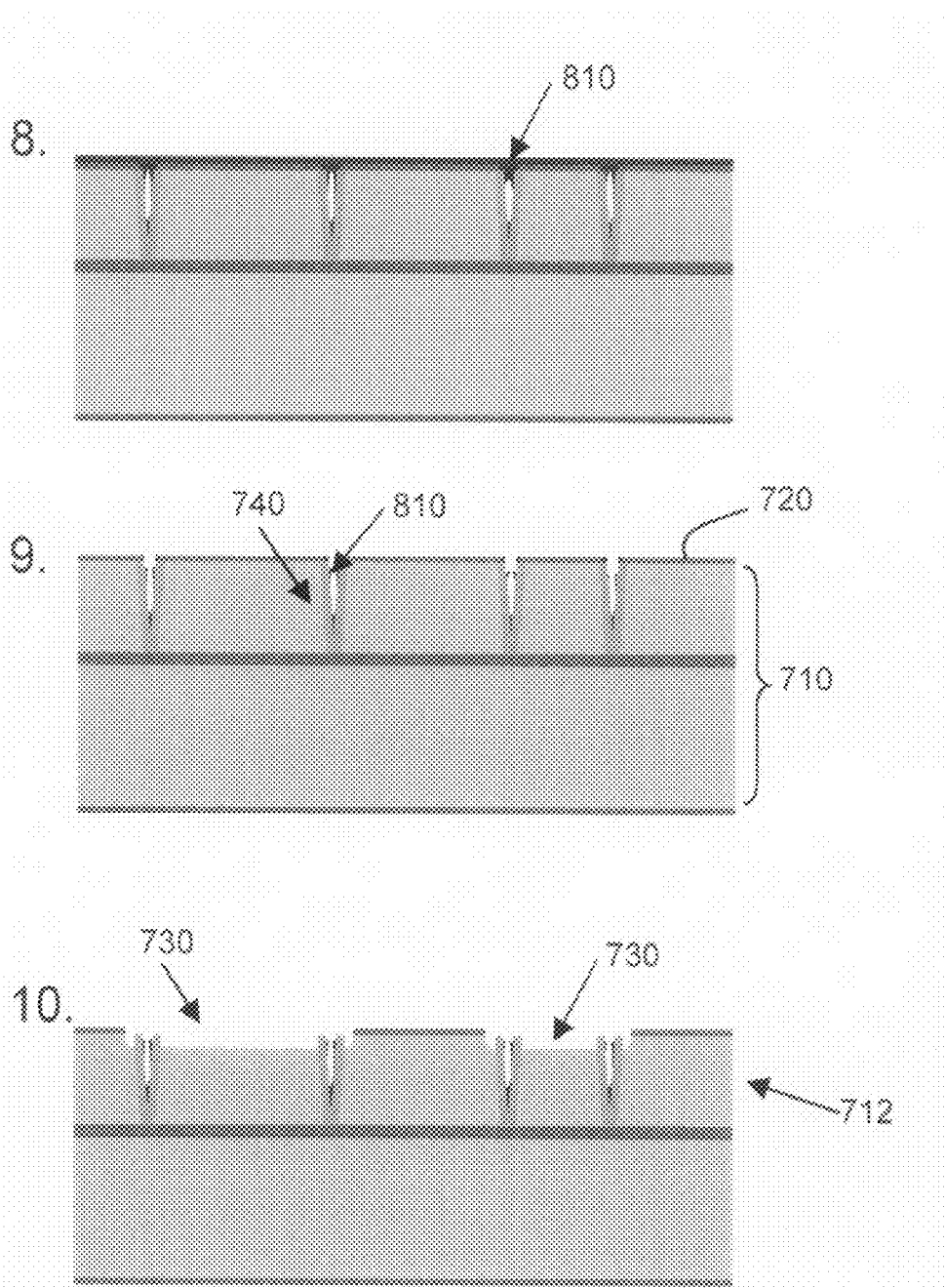
Figure 9:
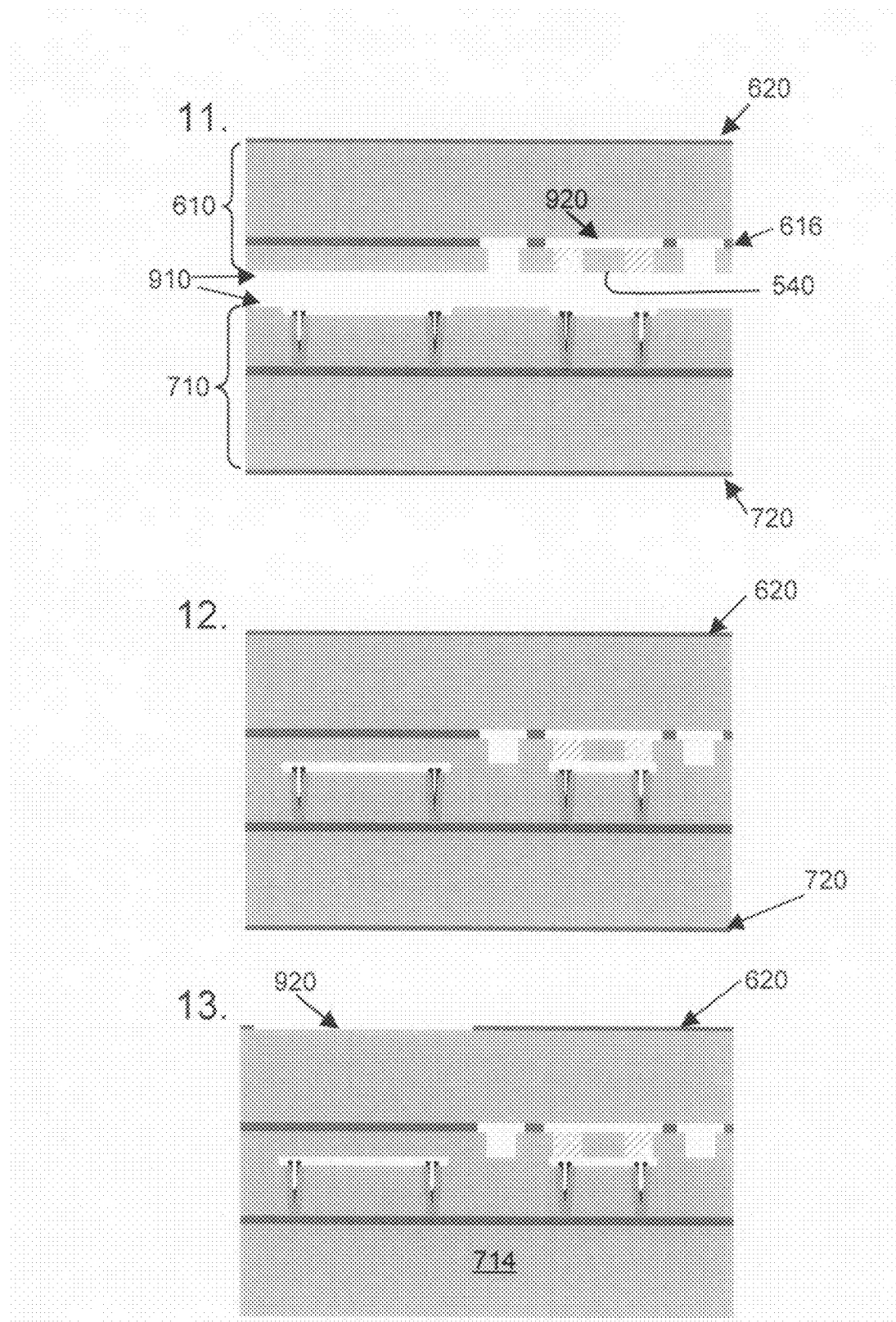
Figure 10:
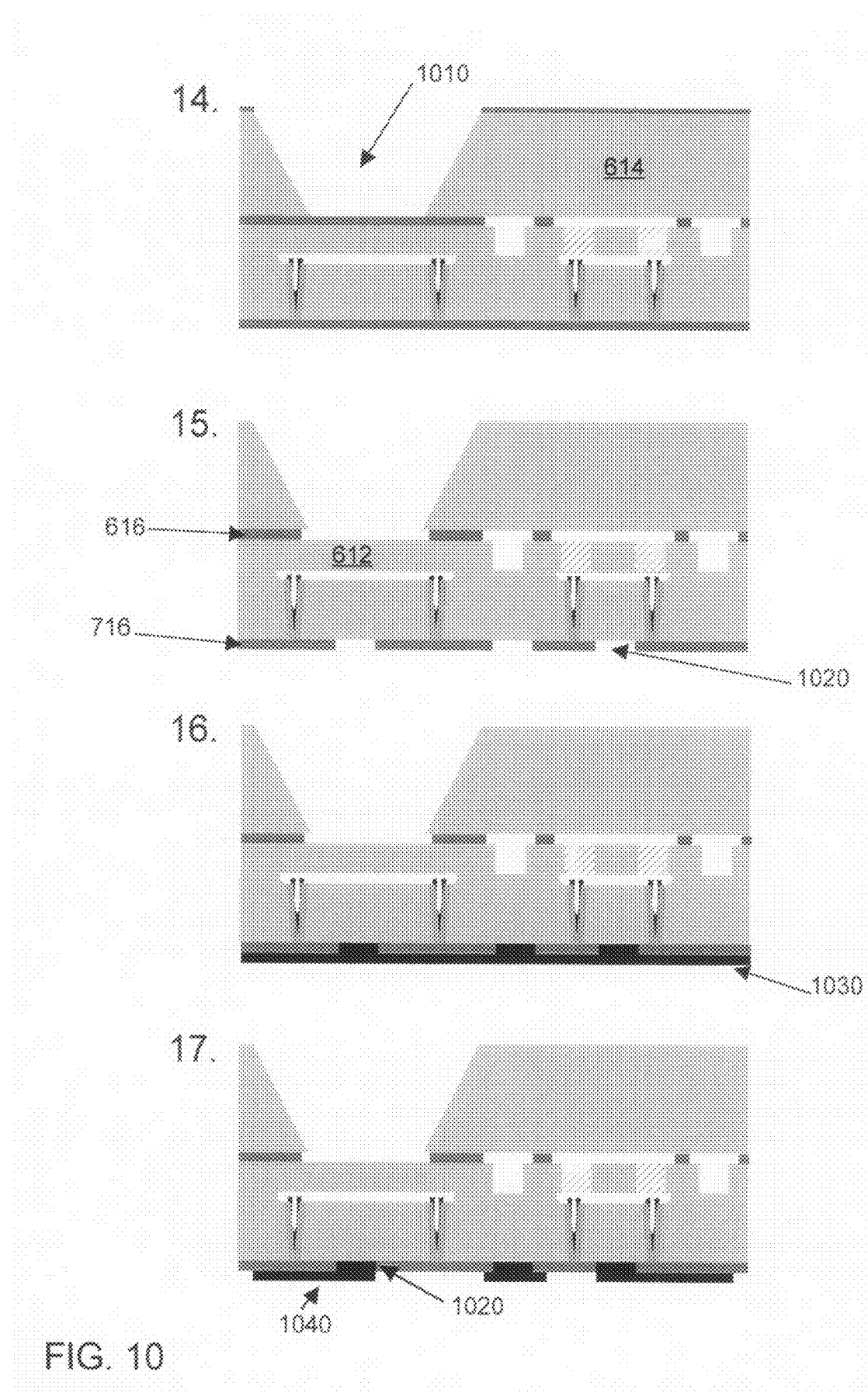

Step 3 is a Deep Reactive Ion Etch (DRIE) etch to form springs 650, etch holes 640, fingers 510, isolation trenches 560, proof mass 550, rotational springs 530 and other structures in the diaphragm layer 612 (See FIG. 5). Other types of sensors such as an angular rate sensor, resonator, or shear sensor could be made in this layer by changing the masking artwork to incorporate other geometries typical of what can be made in a surface micromachined process. Furthermore, multiple types of sensors can be made simultaneously, therefore allowing higher integration levels on one chip. A resonant structure can be made simply by defining a proof mass, spring and comb drive/comb sense combination as recognized by those skilled in the art. Step 4 forms an oxide 720, again through oxidation, on a new SOI wafer 710 containing an active layer 712 of relatively highly doped silicon, which forms isolation trenches defining single crystal silicon electrodes, such as 340, 350, and 370 shown in FIG. 3, and a handle wafer 714, which is etched off or ground and polished off later in the sequence. Step 5 is to etch the oxide 720 in a RIE oxide etcher to form openings 730 in oxide 720. This prepares active layer 712 for a DRIE etch in step 6. In step 6, active layer 712 is DRIE etched from openings 730, stopping on the Box layer 716, forming trenches 740. Care is taken in this etch to avoid a re-entrant trench, which is difficult to fill without voids. In step 7, trenches 740 are oxidized with thermal oxide growth to provide dielectric material 750, which will define and isolate the single crystal silicon electrodes. In step 8, the trenches 740 are filled with polysilicon 810. This reduces the amount of dielectric material required to form the isolation trenches. The entire trench can be filled with dielectric material but it is found to be expensive and difficult if thermal oxide is used because of the required thickness of the oxide. Step 9 is a polysilicon blanket etch of wafer 710, using any type of etcher including a DRIE, RIE or even a barrel etcher, to remove the polysilicon 810 from the surface of wafer 710, stopping on oxide 720 and leaving polysilicon 810 only on the inside of the remaining trench 740. A DRIE etch of silicon layer 712 in step 10 of approximately 0.5 to 2 microns depth forms cavities 730, such as cavity 170 in FIG. 2. Oxide 620 and 720 is removed from surfaces 910 in step 11 using a wet etch such as BOE. This allows surfaces 910 to be aligned and bonded in step 12 using high temperature wafer bonding techniques.

Figure 4:
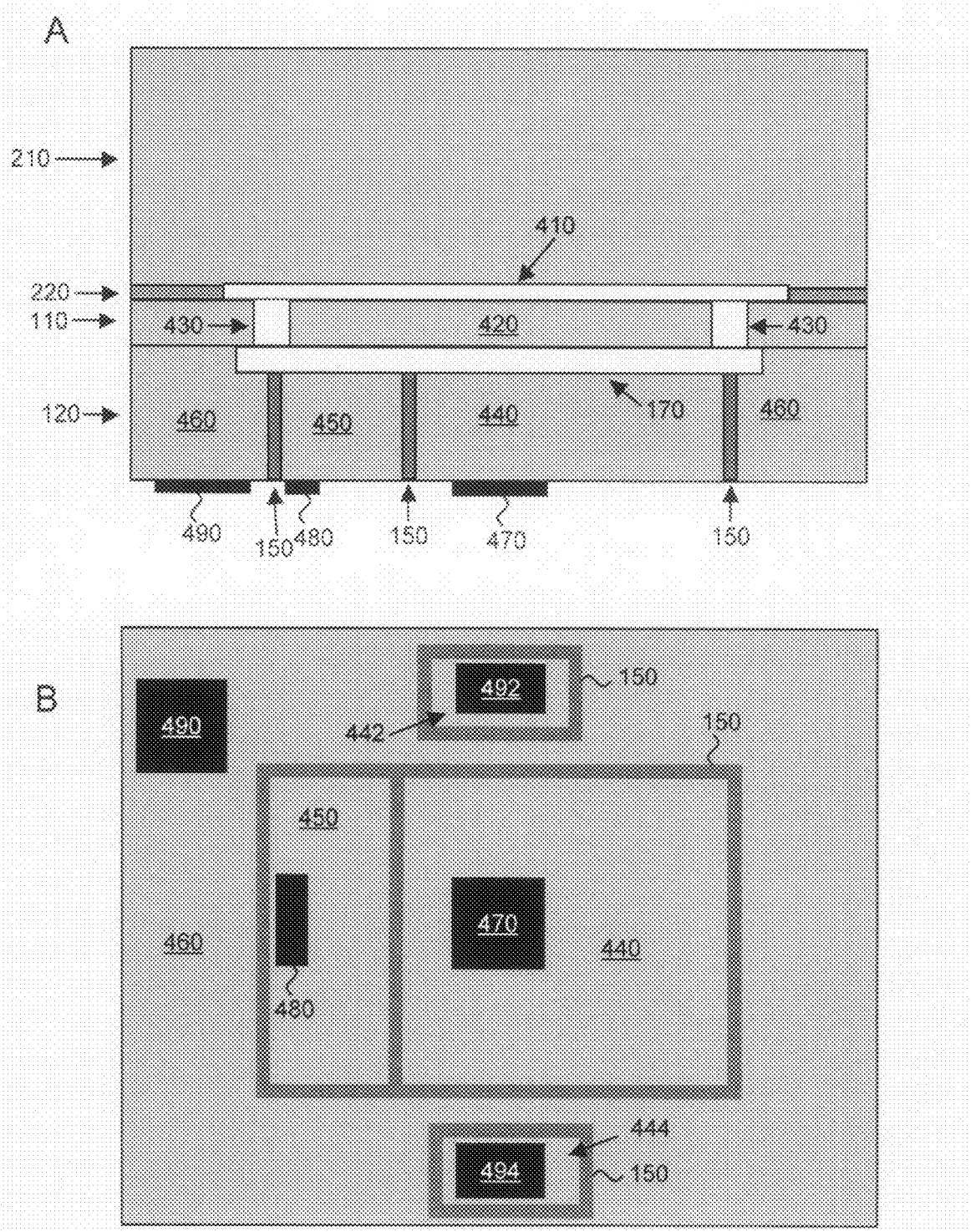
FIG. 4 shows a cross-section (A) and a plan view from the pad side (B) of an accelerometer according to the present invention.

Step 11 also allows the proof mass to be released by undercutting the Box layer 616 and forming gap 920, such as gap 410 in FIG. 4. In step 13, openings 920 are etched in the top oxide 620 using BOE and bottom oxide 720 is removed. This allows silicon layer 614 to be etched in step 14 by DRIE etch creating port 1010, such as port 230 in FIG. 2B. Also in step 14, handle wafer 714 is removed through backgrind and polish or through DRIE etch or RIE etch or a barrel etcher. Step 15 etches Box 616 and Box 716 by using a RIE oxide etch, exposing diaphragm 612 and interconnects 1020, respectively. On the opposite side of port 1010 a metal 1030 is deposited using a sputtering system in step 16. Metal 1030 is etched in step 17 using photolithography and wet etch to form interconnects 1020 and metal bond pads 1040, such as bond pad 160 in FIG. 2.

As one of ordinary skill in the art will appreciate, various changes, substitutions, and alterations could be made or otherwise implemented without departing from the principles of the present invention. Accordingly, the scope of the invention should be determined by the following claims and their legal equivalents.

What is claimed is:

1. A capacitive micro-electro-mechanical sensor, comprising:
   a) a first layer, wherein said first layer has a top surface and a bottom surface, wherein said first layer comprises single-crystal silicon, and wherein said first layer forms at least one single-crystal silicon electrode;
   b) a second layer, wherein said second layer has a top surface and a bottom surface, wherein said second layer comprises single-crystal silicon, and wherein at least one single-crystal silicon electrode in said second layer is defined by an insulating trench of dielectrical material that extends from said top surface to said bottom surface of said second layer; and
   c) at least one electrical contact, wherein said at least one electrical contact is situated on said bottom surface of said second layer and is in electrical connection with said at least one electrode in said second layer;
   wherein said at least one electrode in said first layer and said at least one electrode in said second layer define a capacitor.

2. The capacitive micro-electro-mechanical sensor as set forth in claim 1, wherein said insulating trench forms a periphery around said electrode.

3. The capacitive micro-electro-mechanical sensor as set forth in claim 1, wherein said top surface of said second layer is etched to form a cavity in said second layer, and wherein said cavity defines a capacitive gap.

4. The capacitive micro-electro-mechanical sensor as set forth in claim 1, further comprising a third layer, wherein said third layer comprises single crystal silicon, and wherein said third layer is separated from said top surface of said first layer by a dielectric layer.

5. The capacitive micro-electro-mechanical sensor as set forth in claim 4, wherein said third layer is etched to define a pressure port.

6. The capacitive micro-electro-mechanical sensor as set forth in claim 1, wherein said first layer forms a diaphragm.

7. The capacitive micro-electro-mechanical sensor as set forth in claim 1, wherein said first layer is etched to define at least one of a resonant structure, spring, or proof mass.

8. The capacitive micro-electro-mechanical sensor as set forth in claim 1, wherein said sensor senses at least one of pressure, acceleration, angular rate or resonance.

9. The capacitive micro-electro-mechanical sensor as set forth in claim 1, wherein all sensing elements are located in said first layer.

10. The capacitive micro-electro-mechanical sensor as set forth in claim 1, further comprising at least one electrical guard in said second layer, wherein said at least one electrical guard is defined by a second insulating trench of dielectrical material that extends from said top surface to said bottom surface of said second layer.

\* \* \* \* \*